US012592581B2

(12) United States Patent
Casey et al.

(10) Patent No.: US 12,592,581 B2
(45) Date of Patent: Mar. 31, 2026

(54) ELECTRICAL GRID MONITORING USING AGGREGATED SMART METER DATA

(71) Applicant: X Development LLC, Mountain View, CA (US)

(72) Inventors: Leo Francis Casey, San Francisco, CA (US); Page Furey Crahan, San Francisco, CA (US); Raymond Daly, Palo Alto, CA (US); Nicole Limtiaco, San Francisco, CA (US); Xinyue Li, San Mateo, CA (US); Gaurav Desai, San Jose, CA (US); David Charles Chou, San Jose, CA (US); Peter Evans, Los Altos Hills, CA (US); Matthew L. Ginsberg, Eugene, OR (US); Spencer James Connaughton, New York, NY (US)

(73) Assignee: X Development LLC, Mountain View, CA (US)

( * ) Notice: Subject to any disclaimer, the term of this patent is extended or adjusted under 35 U.S.C. 154(b) by 425 days.

(21) Appl. No.: 17/849,176

(22) Filed: Jun. 24, 2022

(65) Prior Publication Data

US 2022/0416571 A1      Dec. 29, 2022

Related U.S. Application Data

(60) Provisional application No. 63/214,426, filed on Jun. 24, 2021.

(51) Int. Cl.
*H02J 13/00* (2006.01)
*G01R 22/06* (2006.01)
(Continued)

(52) U.S. Cl.
CPC ........ *H02J 13/00002* (2020.01); *G01R 22/06* (2013.01); *G05B 19/0428* (2013.01);
(Continued)

(58) Field of Classification Search
None
See application file for complete search history.

(56) References Cited

U.S. PATENT DOCUMENTS 8,311,681 B1    11/2012  Marcus
9,404,426 B2     8/2016  Wichmann et al.
(Continued)

FOREIGN PATENT DOCUMENTS

WO      WO-2012103896 A1 *  8/2012  ........... H04L 63/065

OTHER PUBLICATIONS

Invitation to Pay Additional Fees in International Appln. No. PCT/US2022/034831, dated Oct. 7, 2022, 13 pages.
(Continued)

*Primary Examiner* — Jennifer L Norton
(74) *Attorney, Agent, or Firm* — Fish & Richardson P.C.

(57) ABSTRACT

A method for electrical grid monitoring using aggregated smart meter data includes receiving, from an electric grid monitoring device, electrical data aggregated from a plurality of electric meters each connected to a secondary side of at least one electrical transformer within a local geographic region. Each electric meter is configured to generate measurement data based on measurements taken at a respective electrical load. The electrical data indicates one or more characteristics of a secondary electrical distribution system connected to the at least one electrical transformer. The method includes determining, based on the electrical data aggregated from the plurality of electric meters, one or more characteristics of the primary electrical distribution system connected to the electrical transformer.

20 Claims, 4 Drawing Sheets

(51) Int. Cl.
  *G05B 19/042* (2006.01)
  *H02J 3/00* (2006.01)
  *H02J 3/38* (2006.01)
(52) U.S. Cl.
  CPC .............. *H02J 3/004* (2020.01); *H02J 3/381* (2013.01); *G05B 2219/2639* (2013.01)

(56) References Cited

U.S. PATENT DOCUMENTS

| | | | |
|---|---|---|---|
| 9,429,974 | B2 | 8/2016 | Forbes |
| 9,501,555 | B2 | 11/2016 | Zhou et al. |
| 9,559,520 | B2 | 1/2017 | Shelton et al. |
| 9,628,010 | B2 | 4/2017 | Clarke et al. |
| 9,846,886 | B2 | 12/2017 | Greene et al. |
| 9,926,852 | B2 | 3/2018 | Tiwari et al. |
| 9,945,264 | B2 | 4/2018 | Wichmann et al. |
| 10,097,240 | B2 | 10/2018 | Hansell et al. |
| 10,097,636 | B1 * | 10/2018 | Maroney ................. G06F 13/28 |
| 10,277,034 | B2 | 4/2019 | Marhoefer |
| 10,373,275 | B2 | 8/2019 | Forbes |
| 10,742,038 | B2 | 8/2020 | McDaniel et al. |
| 10,879,695 | B2 | 12/2020 | Matan et al. |
| 10,892,641 | B2 | 1/2021 | Eckhardt et al. |
| 12,476,467 | B1 * | 11/2025 | Wang ................. H02J 7/00712 |
| 2004/0114737 | A1 * | 6/2004 | MacConnell ........... H04L 12/12 379/106.03 |
| 2005/0278731 | A1 * | 12/2005 | Cameron ............. H04N 21/252 348/E7.07 |
| 2008/0077336 | A1 | 3/2008 | Roosevelt |
| 2013/0030591 | A1 * | 1/2013 | Powell .............. H02J 13/00034 700/295 |
| 2014/0085105 | A1 * | 3/2014 | Vaswani ................. G01D 4/02 340/870.11 |
| 2014/0223526 | A1 * | 8/2014 | Lu ........................... H04L 63/08 726/6 |
| 2014/0277788 | A1 * | 9/2014 | Forbes, Jr. .............. H04L 67/10 700/286 |
| 2014/0277796 | A1 * | 9/2014 | Peskin .............. H02J 13/00034 700/291 |
| 2014/0312693 | A2 * | 10/2014 | Powell ...................... G05F 1/66 307/31 |
| 2015/0094965 | A1 * | 4/2015 | Schneider ................ H02H 6/00 702/58 |
| 2016/0041002 | A1 * | 2/2016 | Alzate Perez ......... G01D 4/004 340/870.02 |
| 2016/0072288 | A1 * | 3/2016 | Debone .................. G06Q 10/06 700/295 |
| 2016/0079752 | A1 * | 3/2016 | Matan .............. H02J 13/00034 307/24 |
| 2016/0087432 | A1 | 3/2016 | Matan et al. |
| 2017/0034124 | A1 * | 2/2017 | Toda ................... H04L 12/1886 |
| 2017/0285081 | A1 | 10/2017 | Silverman |
| 2017/0302511 | A1 | 10/2017 | Foster et al. |
| 2017/0344045 | A1 | 11/2017 | Forbes |
| 2018/0107691 | A1 * | 4/2018 | Boardman ........ H02J 13/00034 |
| 2018/0109137 | A1 * | 4/2018 | Bhageria ................ G05B 15/02 |
| 2018/0332103 | A1 * | 11/2018 | Stanwood .............. H04L 67/10 |
| 2018/0366978 | A1 | 12/2018 | Matan et al. |
| 2019/0041436 | A1 | 2/2019 | Soorya et al. |
| 2020/0136430 | A1 | 4/2020 | Forbes |
| 2021/0080514 | A1 * | 3/2021 | Beaudet ................. G08B 17/00 |
| 2021/0288520 | A1 * | 9/2021 | Cardozo ............. H04L 41/0816 |
| 2022/0198911 | A1 * | 6/2022 | Vadwa ................... G06Q 50/06 |
| 2022/0408522 | A1 * | 12/2022 | Damm ................... H04L 67/51 |
| 2023/0046299 | A1 * | 2/2023 | Toulgoat-Dubois ......................... H02J 13/00002 |

OTHER PUBLICATIONS

Knueven et al., "On Mixed Integer Programming Formulations for the Unit Commitment Problem," NFORMS Journal on Computing, Oct. 2020, 32(4):857-76.
International Search Report and Written Opinion in International Appln. No. PCT/US2022/034831, dated Nov. 28, 2022, 19 pages.
International Preliminary Report on Patentability in International Appln. No. PCT/US2022/034831, dated Jan. 4, 2024, 12 pages.
Office Action in Australian Appln. No. 2022299298, dated Oct. 21, 2024, 4 pages.
Office Action in Australian Appln. No. 2022299298, mailed on Mar. 14, 2025, 3 pages.

* cited by examiner

Figure 3:
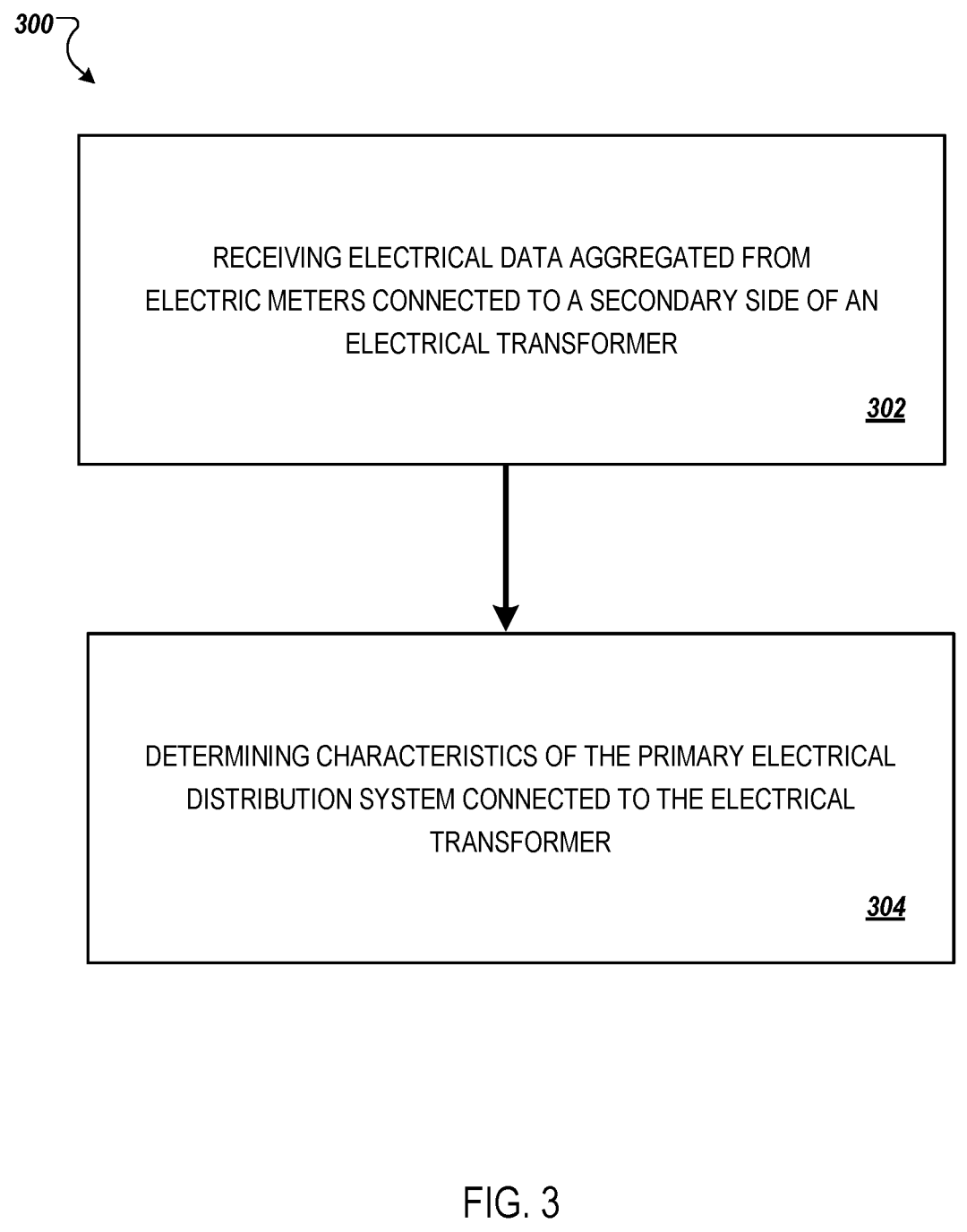

*300*

RECEIVING ELECTRICAL DATA AGGREGATED FROM
ELECTRIC METERS CONNECTED TO A SECONDARY SIDE OF AN
ELECTRICAL TRANSFORMER

*302*

DETERMINING CHARACTERISTICS OF THE PRIMARY ELECTRICAL
DISTRIBUTION SYSTEM CONNECTED TO THE ELECTRICAL
TRANSFORMER

400

DETERMINING, FOR AN ELECTRIC GENERATOR, A FIRST REQUIREMENT
FOR A FIRST TYPE OF RESERVE CAPACITY     *402*

DETERMINING, FOR THE ELECTRIC GENERATOR, A SECOND
REQUIREMENT FOR A SECOND TYPE OF RESERVE CAPACITY     *404*

DETERMINING AN OPERATING LOAD LIMIT FOR THE ELECTRIC
GENERATOR BASED ON THE FIRST REQUIREMENT AND
THE SECOND REQUIREMENT     *406*

OPERATING THE ELECTRIC GENERATOR TO POWER AN ELECTRIC LOAD
AT OR BELOW THE OPERATING LOAD LIMIT     *408*

FIG. 4

ELECTRICAL GRID MONITORING USING AGGREGATED SMART METER DATA

CROSS-REFERENCE TO RELATED APPLICATION

This application claims the benefit of U.S. Provisional Patent Application No. 63/214,426, filed Jun. 24, 2021, the contents of which is incorporated by reference herein.

TECHNICAL FIELD

This specification relates generally to electrical distribution system monitoring systems.

BACKGROUND

Electrical distribution systems transmit electrical power to loads such as residential and commercial buildings through electrical power lines. Most electrical distribution systems are either unmonitored or monitored only by a power substation. For purposes such as grid monitoring, grid simulation, grid planning, a monitoring system capable of monitoring and estimating conditions of a primary electrical distribution system is desirable. Smart meters can be installed on many electrical loads on a secondary side of an electrical distribution system. Smart meters can be used to record and report power usage. Smart meters can also measure other electrical parameters.

SUMMARY

In general, the disclosure relates to systems and methods for monitoring and estimating conditions of an electrical grid based on anonymous aggregated data from smart meters connected to the electrical grid. More specifically, a grid monitoring system can collect data from a cluster of smart meters connected to a secondary side of a distribution transformer in order to estimate conditions and characteristics of the primary side of the transformer. The estimated conditions can include, for example, voltage, current, and electrical power load. The estimated conditions on the secondary side of the distribution transformer can be used to reconstruct parameters, such as voltage and current, on the primary side of the transformer. The estimated conditions can be used for monitoring electrical grid operations in real-time, for monitoring trends in electrical grid operations, and for modeling and simulating operations of the electrical grid.

Electric generating power plants commonly produce three-phase alternating current (AC) electrical power. The three-phase power can be distributed through power lines of an electrical grid to service cables that connect to loads such as residential, commercial, and industrial properties. The voltage in electric power lines can be increased or reduced by electrical transformers located between power plants and loads. On one side of an electrical transformer, the transformer can be connected to a primary electrical distribution system that is connected to a power source. On another side of the electrical transformer, the transformer can be connected to a secondary distribution system that distributes the power to loads.

Smart meters, smart panels, or other electrical monitoring devices can be connected to a service cable at a load, such as a residential property, in order to monitor electricity usage of the load. Data collected by the smart meter can include, for example, voltage, current, power factor, and the amount of energy consumed by the property. Smart meters can have communication capabilities that allow the smart meter to communicate information to the consumer and to electricity suppliers for system monitoring and billing. The smart meters can communicate through wired communications, wireless communications, or both.

A grid monitoring system can aggregate smart meter data collected from multiple loads connected to the secondary side of a distribution transformer. To ensure anonymity of data collected from individual loads, the grid monitoring system can assign individual smart meters to clusters. A cluster can be, for example, a group of smart meters that are connected to the same transformer, a group of smart meters that are located within a same geographic region, or both. The cluster can include, for example, twelve to fifteen smart meters. In some examples, a size of a cluster can be determined in part based on regulatory guidelines. For example, a regulatory guideline may specify a minimum number of loads to be aggregated in order to ensure anonymity of the collected data. In some examples, a cluster can include smart meters from multiple transformers in order to reach the minimum number of clustered smart meters. For example, to reach a minimum of twelve smart meters, a cluster may include a first transformer with three connected smart meters, a second transformer with two connected smart meters, and a third transformer with seven connected smart meters.

In some implementations, one smart meter of a cluster of smart meters can perform the aggregation and send the aggregated data and/or resulting calculations to the grid monitoring system. For example, the grid monitoring system can assign one of the meters of a cluster to be an aggregating meter. Each smart meter within the cluster can send data to the aggregating meter. The aggregating meter can perform the aggregation and transmit data to the grid monitoring system. In this way, the transmitted data is not associated with any identifying information about energy usage of any individual property. The grid monitoring system can change the assignment of aggregating meter over time so that no single smart meter collects all of the data.

The grid monitoring system can use the aggregated smart meter data to estimate characteristics of the primary distribution system. For example, the grid monitoring system can use the aggregated smart meter data to reconstruct the voltage and current on the primary side of the transformer. In an example, multiple single phase loads may be connected in parallel to the same phase of the secondary side of a transformer. The loads will have the same approximate voltage, as measured on the secondary of the transformer. The sum of the power measured at all of the loads can be estimated to be equal to the power supplied by the transformer. Similarly, the sum of the currents measured at all of the loads can be estimated to be proportional to the current measured at the primary side of the transformer, where the proportionality is determined by the turns ratio of the transformer. Thus, the voltage at the primary side of the transformer can be determined based on factors including the turns ratio, the estimated transformer leakage inductance, the real and reactive power of the loads, and the sum of current across the loads.

The grid monitoring system can implement constraints to enable an individual electric generator to provide multiple types of operating reserve. Electricity distribution involves a variety of safeguards. Spinning reserves allow accommodation for generator failure. Secondary reserves allow accommodation for changes in demand or renewable availability. Constraints can be imposed that permit a single electric generator to safely provide both reserve types, resulting in reduced costs and decreasing the time needed to develop energy production plans.

One innovative aspect of the subject matter described in this specification is embodied in methods that include the actions of: receiving, from an electric grid monitoring device, electrical data aggregated from a plurality of electric meters each connected to a secondary side of at least one electrical transformer within a local geographic region, each electric meter configured to generate measurement data based on measurements taken at a respective electrical load. The electrical data indicates one or more characteristics of a secondary electrical distribution system connected to the at least one electrical transformer. The methods include determining, based on the electrical data aggregated from the plurality of electric meters, one or more characteristics of the primary electrical distribution system connected to the electrical transformer.

Another innovative aspect of the subject matter described in this specification is embodied in a system including an electrical transformer connected to a primary electrical distribution system and to a secondary electrical distribution system, and a plurality of electric meters including multiple clusters of electric meters. Each electric meter is configured to generate electrical data based on measurements taken at a respective load of the secondary electrical distribution system, and each electric meter is assigned to one of the multiple clusters of electric meters; and one or more computers and one or more storage devices on which are stored instructions that are operable, when executed by the one or more computers, to cause the one or more computers to perform operations including: for a cluster of the multiple clusters, assigning one of the electric meters in the cluster to aggregate electrical data from each electric meter in the cluster; receiving, from the assigned electric meter, the aggregated electrical data. The aggregated electrical data indicates one or more characteristics of the secondary electrical distribution system connected to the electrical transformer. The methods include determining, based on the aggregated electrical data, one or more characteristics of the primary electrical distribution system connected to the electrical transformer.

These and other embodiments can include the following features, alone or in any combination. In some implementations, the one or more characteristics of the secondary electrical distribution system include at least one of a voltage, a current, or an electrical load.

In some implementations, the method includes assigning the one or more characteristics of the primary electrical distribution system to a position of the primary electrical distribution system that corresponds to a location where the electrical transformer connects to the primary electrical distribution system.

In some implementations, the method includes receiving the aggregated electrical data at designated time intervals.

In some implementations, the method includes assigning another of the electric meters in the cluster to aggregate electrical data from each electric meter in the cluster; and receiving, from the another assigned electric meter, the aggregated electrical data.

In some implementations, the assigned electric meter is configured to aggregate the electrical data by polling each electric meter of the cluster.

In some implementations, the electrical data is aggregated by one of the plurality of electric meters.

In some implementations, the plurality of electric meters are each connected to the same electrical transformer.

In some implementations, the plurality of electric meters include a cluster of multiple clusters of electric meters, the method including assigning each of the plurality of electric meters to the cluster.

In some implementations, assigning each of the plurality of electric meters to the cluster includes determining that the plurality of electric meters are connected to the same phase of the primary electrical distribution system.

In some implementations, assigning each of the plurality of electric meters to the cluster includes assigning a number of electric meters to the cluster that is more than a minimum number of electric meters for anonymity of electrical data.

One innovative aspect of the subject matter described in this specification is embodied in methods that include the actions of: determining, for an electric generator: a first requirement for a first type of reserve capacity, the first requirement including a first amount of electrical power and a first time requirement for providing the first amount of electrical power; and a second requirement for a second type of reserve capacity, the second requirement including a second amount of electrical power and a second time requirement for providing the second amount of electrical power, the second time requirement being different from the first time requirement. The method includes determining an operating load limit for the electric generator based on the first requirement and the second requirement; and operating the electric generator to power an electric load, the electric load being at or below the operating load limit.

These and other embodiments can include the following features, alone or in any combination. In some implementations, the electric generator operating at or below the operating load limit satisfies the first requirement and the second requirement.

In some implementations, the electric generator is one of a plurality of electric generators configured to electrically connect to an electrical distribution system, the method including: determining a load demand of the electrical distribution system; identifying a subset of the plurality of electric generators providing electrical power to the electrical distribution system; determining a load capacity of the electrical distribution system based on the subset of the plurality of electric generators; determining, based on the load demand and the load capacity, that at least one of the first requirement or the second requirement is not satisfied; and in response, determining to electrically connect at least one electric generator of the plurality of electric generators to the electrical distribution system. The at least one electric generator is excluded from the subset.

In some implementations, determining the load demand of the electrical distribution system includes: receiving, from an electric grid monitoring device, electrical data aggregated from a plurality of electric meters each connected to a secondary side of at least one electrical transformer within a local geographic region, each electric meter configured to generate measurement data based on measurements taken at a respective electrical load. The electrical data indicates one or more characteristics of a secondary electrical distribution system connected to the at least one electrical transformer. The method includes determining, based on the electrical data aggregated from the plurality of electric meters, one or more characteristics of a primary electrical distribution system connected to the at least one electrical transformer, the one or more characteristics including the electrical load of the primary electrical distribution system.

In some implementations, the method includes receiving, from an electric grid monitoring device, electrical data aggregated from a plurality of electric meters each connected to a secondary side of at least one electrical transformer within a local geographic region, each electric meter configured to generate measurement data based on measurements taken at a respective electrical load. The electrical data indicates one or more characteristics of a secondary electrical distribution system connected to the at least one electrical transformer. The method includes determining, based on the electrical data aggregated from the plurality of electric meters, one or more characteristics of a primary electrical distribution system connected to the at least one electrical transformer; and determining, based on the one or more characteristics of the primary electrical distribution system, to deploy the electric generator to provide at least one of the first type of reserve capacity or the second type of reserve capacity.

In some implementations, deploying the electric generator includes electrically connecting the electric generator to the primary electrical distribution system.

In some implementations, the electric generator is one of a plurality of electric generators configured to electrically connect to an electrical distribution system. The method includes: determining a respective operating load limit for each of the plurality of electric generator based on the first requirement and the second requirement; and operating each electric generator of the plurality of electric generators to power an electric load, the electric load powered by each electric generator being at or below the respective operating load limit.

In some implementations, the first type of reserve capacity includes spinning reserve capacity, and the second type of reserve capacity includes secondary reserve capacity.

Other embodiments of these and other aspects include corresponding systems, apparatus, and computer programs, configured to perform the actions of the methods, encoded on computer storage devices. A system of one or more computers or other processing devices can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The methods and systems presented herein provide at least the following technical advantages and/or technical improvements over previously available solutions. The techniques can be used to determine voltage on the primary lines throughout the system and to monitor primary voltage for fluctuations and abnormalities. Voltage values outside of an acceptable range from the nominal voltage value can cause power quality events and can violate regulatory requirements.

The disclosed systems and techniques use aggregated data from smart meters in order to estimate the voltage on the primary lines. Smart meters, which are devices capable of measuring energy consumption at a customer site and delivering the information remotely to the distribution system owner, are becoming increasingly common. The disclosed techniques can make use of smart meters that have been previously installed. By taking advantage of the fact that these devices are capable of measuring voltage and current, one could achieve widespread medium-voltage distribution monitoring without an additional large infrastructure investment. Full system instrumentation would be costly, considering the number of sensors needed and the fact that the sensors would need to handle medium-voltage levels. By using secondary side electrical characteristics to estimate primary side electrical characteristics, the instrumentation used does not need to be able to withstand medium voltage levels. Thus, the methods and systems described can be used to monitor primary distribution system parameters without additional instrumentation costs.

There are reasonable privacy concerns around the usage of smart meter data. Having access to a single load's power or current measurements could reveal the behaviors of that particular customer. However, the disclosed techniques use aggregated power and current measurements. The aggregation can be performed over all the loads that share a single transformer, or in some cases, loads that share multiple transformers. The smart meters can perform the aggregation themselves and only send the resulting calculations to the grid monitoring system. Thus, the measurements would not be associated with any identifying information about individual loads or meters. The aggregating meter can be chosen randomly and changed over time so that no single device has access to a large amount of continuous data. The measurement data can be deleted from the aggregating meter after the aggregation and computations are completed, to ensure privacy.

Methods in accordance with the present disclosure may include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

BRIEF DESCRIPTION OF THE DRAWINGS

FIG. 3 is a flowchart of an example process for electrical grid monitoring using aggregated smart meter data.

FIG. 4 is a flowchart of an example process for operating electric generators to satisfy reserve requirements.

Like reference numbers and designations in the various drawings indicate like elements.

DETAILED DESCRIPTION

Figure 1:
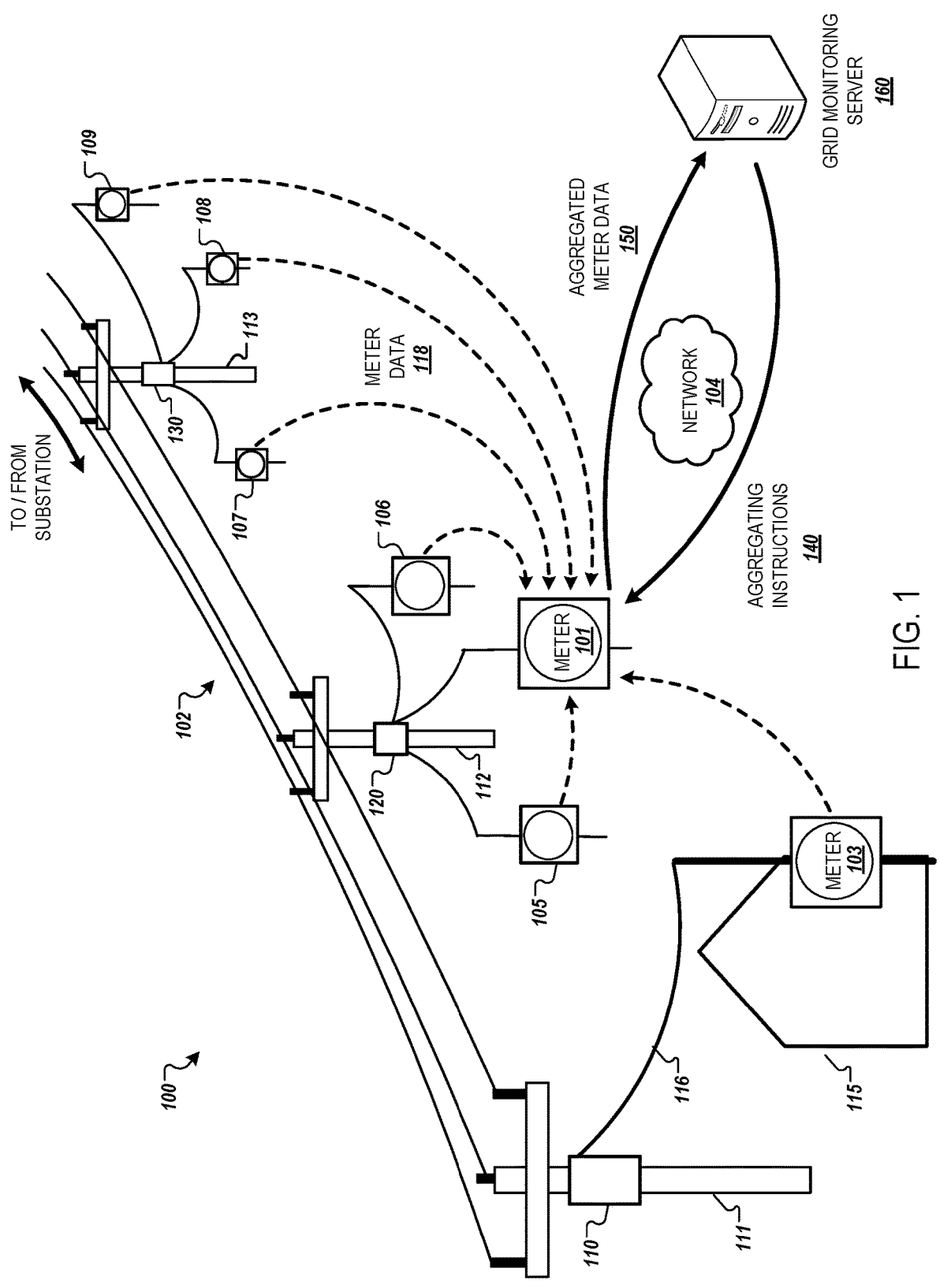
FIG. 1 is a contextual diagram of an example system aggregating smart meter data.

FIG. 1 is a contextual diagram of an example system 100 for aggregating smart meter data. The system 100 includes utility poles 111, 112, and 113. The utility poles 111, 112, and 113 support three-phase primary distribution lines 102. The primary distribution lines 102 transport electrical power from a substation (not shown) to electrical loads.

Electric generating power plants commonly produce three-phase alternating current (AC) electrical power. The three-phase power can be distributed through power lines of an electrical grid to service cables that connect to loads such as residential, commercial, and industrial properties. The voltage of electric power can be increased or reduced by electrical transformers located between power plants and loads. On one side of an electrical transformer, the transformer can be connected to a primary electrical distribution system that is connected to a power source. On another side of the electrical transformer, the transformer can be connected to a secondary distribution system that distributes the power to loads.

The system 100 includes utility poles 111, 112, 113 that each supports a distribution transformer 110, 120, 130 respectively. The distribution transformers 110, 120, and 130 step down the voltage of the electrical power from the primary distribution lines 102 to one or more secondary distribution lines. For example, transformer 110 steps down the voltage from the primary distribution lines 102 to secondary distribution line 116. In some examples, a single transformer connects to a single phase of the primary distribution lines 102.

Although shown in FIG. 1 as supporting a single transformer, in some examples a single utility pole supports more than one transformer, e.g., two or three transformers. In some examples, each transformer supported by a utility pole connects to a different phase of the primary distribution lines. For example, a utility pole can have a first transformer connected to the "A" phase, a second transformer connected to the "B" phase, and a third transformer connected to the "C" phase of the primary distribution lines 102. An example load is a house 115. The house 115 receives electrical power from the secondary distribution line 116.

Smart meters, smart panels, or other electrical monitoring devices can be connected to a service cable at a load, such as a residential property, in order to monitor electricity usage of the load. For example, a meter 103 measures characteristics of power flowing from the secondary distribution line 116 to the house 115. Data collected by the smart meter can include, for example, voltage, current, power factor, and the amount of energy consumed by the property. Smart meters can have communication capabilities that allow the smart meter to communicate information wirelessly or over a fixed communication network to the consumer and to electricity suppliers for system monitoring and billing. Information collected by smart meters can also be used to estimate conditions on the primary sides of transformers.

To ensure anonymity of data collected from individual meters, a grid monitoring system can aggregate smart meter data collected from multiple loads connected to the secondary side of a distribution transformer. Ensuring anonymity of the collected data reduces the ability to use the data to determine a power profile for a specific load or property. In this way, electrical usage of individual residences can be kept private.

An example approach to securing anonymity is to cluster loads in groups of a minimum of N loads, so that a geographic locator of the data is only specific to a cluster of multiple loads. In some examples, a size of a cluster can be determined in part based on regulatory guidelines. For example, a regulatory guideline may specify a minimum number N of loads to be aggregated in order to ensure anonymity of the collected data. In some examples, regulatory guidelines may specify that individual loads cannot exceed a maximum percentage of the total load. In some examples, the maximum percentage of the total load is N percent. The value of N can be, for example, twelve, thirteen, fifteen, etc. The value of N can depend on factors such as location and load type. By aggregating the data in clusters, the data is not easily disaggregated to individual loads, so no individual load profile can be obtained.

To ensure anonymity of data collected from individual loads, the grid monitoring system can assign individual smart meters to clusters. A cluster can be, for example, a group of smart meters that are connected to the same transformer, a group of smart meters that are located within a same geographic region, or both. The cluster can include, for example, twelve to fifteen smart meters. In FIG. 1, an example cluster includes all of the meters shown as being connected to the transformers 110, 120, and 130. The cluster includes meter 103, connected to transformer 110, meters 101, 105, and 106, connected to transformer 120, and meters 107, 108, and 109, connected to transformer 130.

In some examples, a cluster can include smart meters from multiple transformers in order to reach the minimum number of clustered smart meters. For example, to reach a minimum number N of twelve smart meters, a cluster may include a first transformer with three connected smart meters, a second transformer with two connected smart meters, and a third transformer with seven connected smart meters.

In some examples, a cluster can include smart meters from multiple transformers that are within a geographic proximity to each other. For example, a cluster can include smart meters from multiple transformers that are within a maximum geographic range from each other of one hundred meters, two hundred meters, three hundred meters, etc.

In some implementations, one smart meter of a cluster of smart meters can perform aggregation operations and send the aggregated data and/or resulting calculations to the grid monitoring system. For example, the grid monitoring server 160 can provide aggregating instructions 140 to the meter 101. The aggregating instructions 140 can assign the meter 101 to be the aggregating meter. In some examples, the grid monitoring server 160 can assign the meter 101 randomly from the group of meters in the cluster.

In some examples, in addition to sending aggregating instructions 140 to the meter 101, the grid monitoring server 160 can provide the aggregating instructions 140 to all of the meters in the cluster. The aggregating instructions 140 can include instructions that designate the meter 101 as the aggregating meter and instruct the other meters in the cluster to transmit meter data 118 to the meter 101.

In some examples, the aggregating instructions 140 can assign the meters to the cluster. In some examples, the aggregating instructions 140 can indicate a change in instructions from previous instructions. For example, the grid monitoring server 160 can send aggregating instructions 140 to add or remove a meter from the cluster.

In some examples, the grid monitoring server 160 sends aggregating instructions 140 to all of the meters in the cluster. The aggregating instructions 140 can include an assigned sequence of transmitting the electrical data to the meter 101. For example, the aggregating instructions 140 can specify staggered intervals at which each of the meters is to transmit meter data 118 to the meter 101.

In some examples, the aggregating instructions 140 include instructions to the meter 101 to poll all of the meters in the cluster. In some examples, the aggregating instructions 140 can include a polling sequence for the meter 101 to use to poll the meters in the cluster. For example, the meter 101 can send a polling signal to smart meter 103. In response to receiving the polling signal, the smart meter 103 can transmit meter data 118 to the smart meter 101. After receiving the meter data 118 from smart meter 103, the smart meter 101 can then poll the next smart meter in sequence, e.g., smart meter 105.

Each smart meter within the cluster sends meter data 118 to the aggregating meter according to the aggregating instructions. For example, the meters 103, 105, 106, 107, 108, and 109 can send the meter data 118 to the meter 101. In some examples, the smart meters can be configured to wirelessly communicate with each other. For example, the smart meters can be configured to communicate through cellular communications, Bluetooth communications, WiFi communications, a mesh network, etc. In some examples, the smart meters can be configured to communicate through a fixed, e.g., wired, communication network. In some examples, the smart meters can communicate over the distribution lines 102. For example, the smart meters can communicate using a high frequency carrier signal transmitted over the distribution lines 102 or along the distribution lines 102 to the aggregating meter 101.

In some examples, data from the smart meters can be referenced to accurate time references, e.g., a GPS time base or network time. The data from the smart meters can include timestamps indicating the time when the data was collected. The aggregating meters, e.g., meter 101 and meter 103, can therefore synchronize the aggregated data. For example, the meter 101 may receive electrical data from a first meter at 10:02 am, with the data having a timestamp of 10:00 am. The meter 101 may receive electrical data from a second meter at 10:03 am, also with the data having a timestamp of 10:00 am. The aggregating meter 101 can therefore aggregate the data from the first meter and from the second meter, and assign the aggregated meter data a timestamp of 10:00 am.

The aggregating meter can perform the aggregation and transmit data to the grid monitoring system. For example, the meter 101 can aggregate meter data 118 from the meters 101, 103, 105, 106, 107, 108, 109 and can provide aggregated meter data 150 to the grid monitoring server 160. For example, the meter 101 can use the meter data 118 from the meters in the cluster to determine an average voltage on the secondary sides of transformers 110, 120, 130. The meter 101 can then transmit the average secondary side voltage to the grid monitoring server 160. In this way, the transmitted data is not associated with any identifying information about energy usage of any individual property.

In some examples, in addition to or instead of the aggregated meter data 150, the meter 101 can perform calculations using the aggregated meter data and can transmit results of the calculations to the grid monitoring server 160. For example, the meter 101 can calculate an estimated primary side voltage from the averaged secondary side voltage, and can transmit the estimated primary side voltage to the grid monitoring server 160.

The aggregated meter data 150 can include, for example, aggregated electrical load data, aggregated voltage data, and aggregated current data. In some examples, the aggregated meter data 150 can include a near real-time total electrical load of the cluster. In some examples, the aggregated meter data 150 includes averaged data, e.g., average voltage data from the smart meters in the cluster. In some examples, the aggregated meter data 150 includes summed data, e.g., a sum of the current measured by the smart meters in the cluster. In some examples, the aggregated meter data 150 includes filtered data. For example, the meter 101 can aggregate the meter data 118 and perform filtering operations to filter out noise. In some examples, the aggregated meter data 150 includes a number of meters that provided meter data 118. For example, the aggregated meter data 150 can indicate that the aggregated meter data 150 was determined using data from seven smart meters.

In some examples, the grid monitoring system can change the assignment of aggregating meters over time so that no single smart meter collects all of the data. For example, the aggregating instructions 140 can assign the meter 101 as the aggregating meter for a period of time, e.g., of a day, a week, or a month. The aggregating instructions 140 can assign a different meter, e.g., meter 103, as the aggregating meter for another period of time after the meter 101 was assigned. In some examples, the aggregating instructions 140 can assign the meter 103 randomly from the group of meters in the cluster. In some examples, the aggregating instructions can change assignments at random intervals. For example, the aggregating instructions 140 can assign the meter 101 as the aggregating meter for one day, and then can assign the meter 103 as the aggregating meter for five days, and then can assign the meter 105 as the aggregating meter for twelve hours. In another example, the aggregating instructions can assign the meter 101 as the aggregating meter for one month, and then can assign the meter 108 for one month, and then can assign the meter 109 as the aggregating meter for two weeks.

The meter 101 can transmit the aggregated meter data 150 to the grid monitoring server 160 over the network 104 using a communications interface. The communication interface is a network interface, e.g., a cellular network interface, a local area network interface (e.g., Wi-Fi interface), a fiber optic interface, or another appropriate networking interface.

In some examples, the meter 101 can store some data in a memory, while transmitting other data to the grid monitoring server 160. The meter 101 can determine to store certain electrical current data and to transmit certain electrical current data, for example, based on pre-programmed settings, or based on the capabilities and usage of the network. For example, the meter 101 can store meter data 118 in a memory, and transmit aggregated meter data 150 to the grid monitoring server 160. In some examples, the meter 101 deletes the stored data, e.g., after receiving a confirmation signal from the grid monitoring server, after receiving an instruction from the grid monitoring server 160 to delete the data, or after a predetermined period of time has elapsed.

In some examples, the aggregating instructions 140 can assign a meter in the cluster to be a backup aggregating meter. For example, the aggregating instructions 140 can assign the meter 101 to be the primary aggregating mater, and the meter 103 to be the backup aggregating meter. When both meter 101 and meter 103 are functioning properly, both meter 101 and meter 103 can collect meter data 118 from meters in the cluster. In some examples, when both meter 101 and meter 103 are functioning properly, meter 101 can transmit aggregated meter data 150 and meter 103 can transmit backup aggregated meter data to the grid monitoring server 160. Therefore, if the meter 101 fails to send the aggregated meter data 150, the grid monitoring server 160 can monitor grid conditions using the backup aggregated meter data.

In some examples, when both aggregating meter 101 and backup aggregating meter 103 are functioning properly, meter 101 transmits aggregated meter data 150 to the grid monitoring server 160, and the grid monitoring server 160 samples backup aggregated meter data from meter 103. For example, the meter 101 may transmit the aggregated meter data 150 to the grid monitoring server 160 at more frequent time intervals, e.g., once per minute, and the meter 103 may transmit the backup aggregated meter data to the grid monitoring server 160 at less frequent time intervals, e.g., once per thirty minutes. The grid monitoring server 160 can compare the sampled backup aggregated meter data from meter 103 with the aggregated meter data 150 from meter 101 to verify consistency between the aggregated meter data 150 and the backup aggregated meter data. If the difference between the aggregated meter data 150 and the backup aggregated meter data is greater than a threshold difference, the grid monitoring server 160 can performing one or more actions such as generating an alert for a user, assigning a new primary aggregating meter, assigning a new backup aggregating meter, increasing frequency of collecting aggregated meter data, etc.

With meter 101 assigned as the primary aggregating meter and meter 103 assigned as the backup aggregating meter, if meter 101 fails to send aggregated meter data 150 to the grid monitoring server 160, the grid monitoring server 160 can send new aggregating instructions 140 assigning meter 103 as the new primary aggregating meter. The aggregating instructions 140 can also assign a new backup aggregating meter, e.g., meter 108. For example, the meter 101 may be configured to transmit aggregated meter data 150 to the grid monitoring server 160 at time intervals, e.g., of once every five minutes. If the meter 101 misses more than a threshold number of time intervals, the grid monitoring server 160 can determine that the meter 101 has failed and assign a new primary backup meter. For example, the threshold number of time intervals can be three time intervals. The meter 101 may miss three time intervals, e.g., by not sending aggregated meter data 150 for fifteen minutes, or three five-minute intervals. In this example, if at least fifteen minutes passes after receiving aggregated meter data 150 from the meter 101, and the meter 101 does not send new aggregated meter data 150, the grid monitoring server 160 can assign a new primary aggregating meter, e.g., by assigning meter 103 as the new primary aggregating meter.

In some examples, if a meter of the cluster fails to send meter data 118 to the aggregating meter, the aggregating meter or the grid monitoring server 160 can perform computations to interpolate the missing data using the data from the other meters of the cluster. In some examples, if more than a threshold number of meters of the cluster fail to send meter data 118 to the aggregating meter, the grid monitoring server 160 can determine to cease obtaining data from the aggregating meter until at least a minimum number of meters are restored. For example, a cluster may include twelve meters. A threshold number of meters for ensuring customer anonymity, data accuracy, or both, may be set at ten meters. If three of the twelve meters fail, the number of meters providing meter data 118 to the aggregating meter will be nine meters, which is less than the threshold number of ten meters. The aggregating meter can determine that the number of meters providing meter data 118 is less than the threshold number of meters. In response, the aggregating meter can perform one or more actions such as ceasing to send aggregated meter data 150 to the grid monitoring server 160, sending a message to the grid monitoring server 160 indicating that the number of functional meters is less than the minimum threshold, etc. If at least one meter is restored and sends meter data 118 to the aggregating meter, the aggregating meter can perform an action such as re-initiating sending the aggregated meter data 150 to the grid monitoring server 160, sending a message to the grid monitoring server 160 indicating that the number of functional meters is at or above the minimum threshold, etc.

In some examples, if greater than a threshold number of meters fails to send meter data 118 to the aggregating meter, if the aggregating meter fails to send aggregated meter data 150 to the grid monitoring server 160, or both, the grid monitoring server 160 may determine that there is insufficient data availability from the cluster. In some examples, when one cluster fails, the grid monitoring server 160 can interpolate or infer grid conditions using data from other clusters.

In some examples, the grid monitoring server 160 can determine that multiple clusters have failed, indicating a widespread problem such as a cyber attack. In response to determining that multiple clusters have failed, the grid monitoring server 160 can evaluate availability of replacement data from alternative data sources. Alternative data sources can include, for example, grid instrumentation on the primary or secondary side of the electrical distribution system. The grid monitoring server 160 can then perform an action such as switching to a backup monitoring mode that includes obtaining data from one or more available alternative data sources.

In some examples, instead of or in addition to an aggregating meter, the system 100 can include an aggregating device. The aggregating device can be, for example, a device that is not associated with a particular load. The aggregating device can be an aggregating device that is owned by and/or operated by an electrical utility. The aggregating device can be assigned to collect, aggregate, and transmit electrical data from the cluster to the grid monitoring server 160.

The grid monitoring server 160 can be a computer server or group of computer servers maintained by an electrical utility or service provider. The grid monitoring server 160 receives the aggregated meter data 150 from the meter 101. The grid monitoring server 160 can include a communications interface for communicating with the smart meters, e.g., meter 101.

The grid monitoring server 160 can access stored data related to each of the smart meters, each of the transformers, or both. For example, the grid monitoring server 160 can store, or can access from a database, data indicating a location of each smart meter and a location of each transformer. The stored data can also include, for each smart meter, data indicating a particular transformer that serves the load measured by the smart meter. In some examples, the stored data can include a unique identifier for each smart meter and for each transformer.

For example, the grid monitoring server 160 can store data indicating that the smart meters 107, 108, and 109 are each connected to transformer 130, The grid monitoring server 160 can store locations of each of the smart meters 107, 108, and 109, and a location of the transformer 130. In some examples, the stored location of a grid asset such as a smart meter or transformer can include a geographic coordinate location, e.g., a latitude and longitude of the location of the grid asset.

The grid monitoring server 160 can communicate with the meter 101 over the network 104 using, for example, a long-range wired or wireless connection. The network 104 can be a long range communication network and can include the internet. The grid monitoring server 160 may connect via Wi-Fi, Bluetooth, or any other protocol used to communicate with the meters, e.g., meter 101.

In some implementations, the grid monitoring server 160 can continuously, or near continuously, receive the aggregated meter data 150. In some implementations, the grid monitoring server 160 can receive the aggregated meter data 150 periodically. For example, the grid monitoring server 160 can receive the aggregated meter data 150 once per second, once per minute, once every fifteen minutes, or once per hour.

In some implementations, the grid monitoring server 160 can obtain the aggregated meter data 150 in response to an event. For example, the grid monitoring server 160 can obtain the aggregated meter data 150 in response to a loss of power to part of the electrical distribution system. In some implementations, in response to a detected event, the grid monitoring server 160 can send aggregating instructions 140 requesting data, and in response, the meter 101 can transmit the aggregated meter data 150 to the grid monitoring server 160.

In some implementations, the grid monitoring server 160 can obtain the aggregated meter data 150 in response to a user request. For example, a user can input a request to the grid monitoring server 160, e.g., through a user interface, requesting updated electrical grid information. In response to the user request, the grid monitoring server 160 can send the aggregating instructions 140 to the meter 101 and the meter 101 can provide the aggregated meter data 150 to the grid monitoring server 160.

The grid monitoring server 160 can store the aggregated meter data 150 and can analyze the aggregated meter data 150 to determine characteristics of the primary side of the electrical distribution system. The grid monitoring server 160 can include a processor or other control circuitry configured to execute instructions of a program that can analyze the aggregated electrical data to determine characteristics of the primary electrical distribution system. The grid monitoring server can use the aggregated smart meter data to estimate characteristics of the primary distribution system. For example, the grid monitoring system can use the aggregated smart meter data to reconstruct the voltage and current on the primary side of the transformers.

The grid monitoring server 160 can assign the reconstructed characteristics, e.g., voltage and current, to a position on the primary electrical distribution lines. For example, the grid monitoring server 160 may assign the reconstructed voltage and current to a position of the primary distribution system that is representative of the locations of the transformers. The position can be, for example, an averaged coordinate position of the transformers 110, 120, and 130. In some examples, the grid monitoring server 160 can assign the reconstructed characteristics to the length of the primary distribution that extends from the transformer 110 to the transformer 130. For example, the grid monitoring server 160 can estimate that any point between the transformer 110 and the transformer 130 has the estimated voltage and current determined using the aggregated meter data 150.

Figure 2:
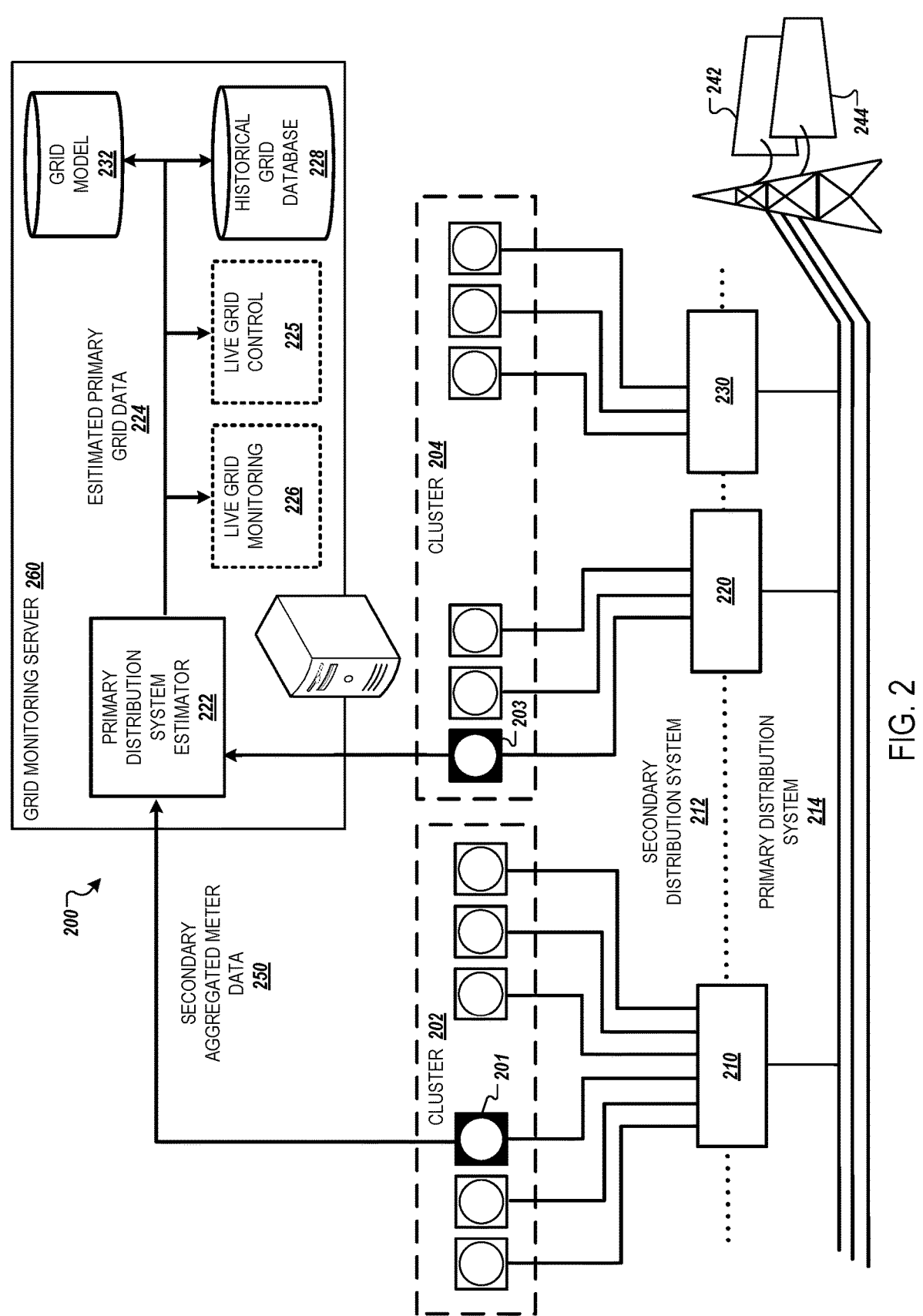
FIG. 2 is a schematic diagram of an example system for electrical grid monitoring using aggregated smart meter data.

FIG. 2 is a schematic diagram of an example system 200 for electrical grid monitoring using aggregated smart meter data. The system 200 includes a grid monitoring server 260, primary distribution system 214, and secondary distribution system 212. The system 200 also includes transformers 210, 220, and 230.

The number of loads connected to an individual transformer can vary. For example, in some geographic areas, the number of loads connected to a transformer may be between one and five loads. In some geographic areas, the number of loads connected to a transformer may be between five and twelve loads, or between ten and twenty-five loads.

In the example of FIG. 2, for simplicity of illustration, a minimum number of loads N in a cluster for anonymity is six loads. In some cases, the minimum number of loads N in a cluster may be, e.g., ten loads, twelve loads, fifteen loads, or twenty loads. The transformer 210 serves six loads, with each load represented in FIG. 2 by a meter connected to the transformer 210. Meters connected to the transformer 210 are grouped into cluster 202. Meter 201 is assigned as an aggregating meter for cluster 202. The transformers 220, and 230 each serve a smaller number of loads than the minimum of six loads. Specifically, the transformers 220 and 230 each serve three loads, with each load represented in FIG. 2 by a meter connected to the respective transformer.

When individual transformers serve fewer loads than the minimum required for anonymity, loads from several neighboring transformers on the same phase can be clustered together to achieve the required minimum number for regulated anonymity. For example, the loads connected to transformer 220 can be clustered with the loads connected to transformer 230 to form a cluster with at least the minimum number of six loads. The loads connected to transformers 220 and 230 are therefore grouped into cluster 204. Meter 203 is assigned as an aggregating meter for cluster 204.

The meter 201 and the meter 203 transmit secondary aggregated meter data 250 to the grid monitoring server 260. In some implementations, the grid monitoring server 260 controls the timing of the meter 201 and the meter 203 transmitting the secondary aggregated meter data 250 to the grid monitoring server 260. For example, the grid monitoring server 260 can instruct the meter 201 and the meter 203 to transmit secondary aggregated meter data 250 to the grid monitoring server 260 at staggered intervals. In some examples, the grid monitoring server 260 can poll each aggregating meter including the meter 201 and the meter 203. In some examples, the grid monitoring server 160 can receive secondary aggregated meter data 250 from hundreds or thousands of aggregating devices.

The grid monitoring server 260 includes a primary distribution system estimator 222. The primary distribution system estimator generates estimated primary grid data 224 based on secondary aggregated meter data 250. The grid monitoring server 260 can store the estimated primary grid data 224 in a historical grid database 228, in a grid model 232, or both. In some implementations, the grid monitoring server 260 can use the estimated primary grid data 224 for live grid monitoring 226.

The primary distribution system estimator 222 can use the aggregated meter data 250 to estimate characteristics of the primary distribution system 214. For example, the primary distribution system estimator 222 can use the aggregated meter data 250 to reconstruct the voltage and current on the primary side of the transformers 210, 220, 230.

The primary distribution system estimator 222 can store data indicating characteristics and parameters of the electrical distribution system. For example, the primary distribution system estimator 222 can store data indicating ratings of each of the transformers, e.g., transformer 210, 220, and 230. The ratings of the transformers can include, for example, a turns ratio of each transformer and an estimated transformer leakage inductance of each transformer. The primary distribution system estimator 222 can also store data indicating a location of each transformer and a number of loads connected to each transformer.

Multiple single phase loads may be connected in parallel to the same phase of the secondary side of a transformer. The primary distribution system estimator 222 can use the secondary side characteristics determined using the aggregated meter data 250 to estimate the voltage at the primary side of the transformer 210 based on factors including the turns ratio, the estimated transformer leakage inductance, the real and reactive power of the loads in the cluster 202, and the sum of current across the loads in the cluster 202. Given the real and reactive power and the root mean square (RMS) value and phase angle of the current at a particular time summed across all of the loads of the cluster, the primary distribution system estimator 222 can estimate the RMS value and phase angle of electrical characteristics of the primary side of the transformer. The electrical characteristics can include voltage, current, and real and reactive power.

The loads, e.g., the loads of cluster 202, likely have the same approximate voltage, as measured on the secondary of the transformer 210. The primary distribution system estimator 222 can therefore use the averaged voltage of the loads on the secondary side of the transformer 210 to estimate the voltage on the primary side of the transformer 210.

Similarly, the primary distribution system estimator 222 can use the sum of the power measured at all of the loads in the cluster 202 to estimate the power supplied by the transformer 210. The sum of the power measured at all the loads connected to a transformer is approximately equal to the power supplied, and is indicative of power measured at the primary side of the transformer.

Additionally, the sum of the currents measured at all the loads connected to the transformer is proportional to the current measured at the primary side of the transformer, where the proportionality is given by the turns ratio of the transformer. Therefore, the primary distribution system estimator 222 can use the sum of the currents measured at all of the loads of the cluster 202 to estimate the current measured at the primary side of the transformer 210, where the proportionality is determined by the turns ratio of the transformer 210.

In the example of cluster 204, the loads of the cluster 204 are connected to two different transformers 220, 230. In some examples, loads of the transformers 220, 230 can be clustered based in part on proximity requirements, e.g., a distance between the transformers 220, 230 being less than a threshold distance. Proximity requirements can also include a requirement that the transformers 220, 230 may be neighboring transformers, such that the transformers 220, 230 are adjacent to one another along the primary distribution system 214. In some examples, loads of the transformers 220, 230 can be clustered based in part on requirements for similarity of electrical characteristics, e.g., a requirement that the transformers 220, 230 are connected to the same phase of the secondary distribution system 212, have a same power rating, have a same current rating, etc.

The voltages can be estimated to be the same as measured on the secondary of the transformers 220, 230. The loads, e.g., the loads of cluster 204, therefore have the same approximate voltage, as measured on the secondary of the transformer 210. The sum of the power measured at all of the loads in the cluster 204 can therefore be estimated to be equal to the power supplied by the transformers 210, 230. Similarly, the sum of the currents measured at all of the loads of the cluster 204 can be estimated to be proportional to the current measured at the primary side of the transformers 220, 230. Thus, the voltage at the primary side of the transformers 220, 230 can be estimated. The parameters of the primary distribution system 214 that are estimated using data from the cluster 204 can be assigned to a position of the primary distribution system 214 that is located between the transformer 220 and 230.

The primary distribution system estimator 222 generates estimated primary grid data 224. The primary grid data 224 can include the estimated current data, voltage data, and electrical power load data for the primary distribution system 214. The primary grid data 224 can include parameter values associated with timestamps and locations. The timestamps can indicate the time when the data was collected, and the locations can be the estimated location of the cluster that produced the aggregated data from which the parameter was calculated.

In some implementations, the estimated primary grid data 224 can be used for live grid monitoring 226. For example, estimated parameters can be presented on a display, e.g., to a grid operator for monitoring in real time or near-real time.

Live grid monitoring 226 can include monitoring the electrical distribution system to ensure the electrical capacity is sufficient to support load demand while satisfying physical and operational constraints. In some examples, the grid monitoring server 260 can determine recommended actions, and present the recommended actions on a display. Recommended actions can include, for example, starting up or shutting down an electrical generator.

In some implementations, the grid monitoring server 260 can perform live grid control operations 225. For example, the grid monitoring server 260 can include control circuitry and/or can communicate with control devices that permit the grid monitoring server 260 to control components of the electrical distribution system. The grid monitoring server 260 can perform live grid control, for example, by starting up or shutting down components of the electrical distribution system. In some examples, the grid monitoring server 260 can control operations of electrical power sources, e.g., electric generators 242, 244.

In some examples, the grid monitoring server 260 can determine electrical distribution system requirements based on the estimated primary grid data 224, and can perform live grid control operations 225 to satisfy the electrical distribution system requirement. For example, the grid monitoring server 260 can use the estimated primary grid data 224 to determine current electrical load, forecasted electrical load or both. The grid monitoring server 260 can control operations of the electric generators 242, 244 to accommodate the current electrical load and/or forecasted electrical load while satisfying operational requirements such as operating reserve capacity requirements.

Operating reserve includes spinning reserve and secondary reserve. Operating reserve can include other types of reserves, such as frequency-response reserve and replacement reserve. In general, a single generator is permitted to provide at most one type of reserve. For example, a generator may be restricted to providing secondary reserve or spinning reserve, but not both.

Spinning reserve is a type of operating reserve that enables operating generators to accommodate additional load requirements that occur when another generator, such as a spinning generator or a renewable generator, fails. A spinning reserve requirement can specify that if any currently producing generator stops producing electricity, or produces a reduced output, it must be possible to replace that generator's output using the spare capacity of one or more other generators. The spinning reserve requirement may specify a time requirement for availability of the spinning reserve. The time requirement may be, for example, ten minutes or less.

Secondary reserve enables operating generators to accommodate changes in demand and changes in renewable energy availability. The secondary reserve requirement may specify a time requirement for availability of the secondary reserve. The time requirement may be, for example, thirty minutes or less.

In some implementations, the grid monitoring server 260 can impose constraints that enable a single generator to provide two or more types of reserve. The grid monitoring server 260 can determine operational parameters of electrical distribution system components that satisfy the constraints while minimizing a cost of operation. The constraints can be imposed in order to allow individual generators to meet more than one kind of reserve requirement and to ensure that reserve requirements are met in aggregate if the constraints are satisfied.

In some examples, the grid monitoring server can determine the requirements for each of two or more types of reserve capacity. A load limit for a particular generator can be determined based on the requirements, such that the particular generator operating at the load limit satisfies requirements for the two or more types of reserve capacity.

Each electrical power source, e.g., electric generators 242, 244, can be operated at loads that permit the generator to simultaneously be capable of providing the spinning reserve within the applicable time requirement, e.g., of ten minutes, and of providing the secondary reserve within the applicable time requirement, e.g., of thirty minutes. The generators can be operated to provide an amount of electrical power that is at or below the load limit. For example, the load limit for the particular generator may be seventy percent of the capacity of the generator, and the generator can be operated at or below the load limit of seventy percent capacity as a way of meeting both spinning and secondary reserve requirements.

In some examples, multiple generators power an electrical distribution system. In some cases, a single generator can provide two or more types of reserve capacity, and other generators can provide a single type of reserve capacity. In some cases, each of the multiple generators can provide two or more types of reserve capacity. The multiple generators can be located within a geographic area, and the reserve requirement associated with these generators can be applicable to the geographic area. The disclosed techniques can be used to determine an operating schedule for the multiple generators, and to adjust operating states of the multiple generators according to the operating schedule. The multiple generators can be operated to meet forecasted load while satisfying physical and operational constraints. Each of the multiple generators can be operated such that combined reserve satisfies the reserve requirements for the electrical distribution system.

To perform live grid monitoring 226, the grid monitoring server can determine whether electrical generation capacity satisfies operational requirements based on the load conditions of the electrical distribution system. In some examples, the grid monitoring server 260 may determine that operational requirements are not met, due the load capacity being insufficient to support load demand while maintaining reserve capacity. In response, the grid monitoring server 260 can perform a control action such as starting up an additional electric generator and/or connecting an additional generator to the electrical distribution system. In some examples, the grid monitoring server 260 may determine that operational requirements are met, and that the load capacity is overly sufficient, such that excess reserve capacity exists. In response, the grid monitoring server 260 can perform a control action such as shutting down an electric generator and/or disconnecting an electric generator from the electrical distribution system.

To perform live grid monitoring 226, the grid monitoring server can determine whether reserve capacity is to be employed based on the load conditions of the electrical distribution system. In some examples, the grid monitoring server 260 may determine that spinning reserve, secondary reserve, or both, are required. For example, the grid monitoring server 260 may determine that one or both types of reserve are needed due to failure of a power source or unexpected load on the electrical distribution system. In response, the grid monitoring server 260 can perform a control action such as deploying one or more electric generators, e.g., electric generator 242, 244, or both, to provide the needed reserve capacity. Deploying an electric generator can include starting up a reserve electric generator, electrically connecting a reserve generator to the electrical distribution system, or any combination of these actions.

In some implementations, the estimated primary grid data 224 can be stored in a historical grid database 228. The historical grid database 228 can store estimated primary grid data 224 collected over periods of time, e.g., months and years. The historical grid database 228 can be used to monitor trends in performance of the primary distribution system 214.

In some implementations, the estimated primary grid data 224 can be input to a grid model 232. The grid model 232 can include a virtual model of the primary distribution system 214. The grid model 232 can be used in simulation of electrical operations. The grid model 232 can be updated using the estimated primary grid data 224 in order to improve accuracy of modeling and simulation of the electric grid.

FIG. 3 is a flowchart of an example process 300 for electrical grid monitoring using aggregated smart meter data. The process 300 can be performed by a computing system including one or more computers, e.g., grid monitoring server 260. The example process 300 for electrical grid monitoring using aggregated smart meter data includes receiving, from an electric grid monitoring device, electrical data aggregated from a plurality of electric meters each connected to a secondary side of at least one electrical transformer within a local geographic region (302). For example, the grid monitoring server 260 can receive, from the meter 203, the secondary aggregated meter data 250. The secondary aggregated meter data 250 is aggregated from the plurality of electric meters of cluster 204, which are each connected to a secondary side of the transformer 220 or 230.

The example process 300 includes determining, based on the electrical data aggregated from the plurality of electric meters, one or more characteristics of the primary electrical distribution system connected to the at least one electrical transformer (304). For example, the grid monitoring server 260 can determine, based on the secondary aggregated meter data 250, characteristics of the primary distribution system 214 that is connected to the transformers 220 and 230.

FIG. 4 is a flowchart of an example process 400 for operating electric generators to satisfy reserve requirements. The process 400 can be performed by a computing system including one or more computers, e.g., grid monitoring server 260. The example process 400 for operating electric generators to satisfy reserve requirements includes determining, for an electric generator, a first requirement for a first type of reserve capacity (402). For example, the first requirement for electric generator 242 can be to provide fifteen megawatts (MW) within ten minutes for spinning reserve capacity.

The process 400 includes determining, for the electric generator, a second requirement for a second type of reserve capacity (404). For example, the second requirement for electric generator 244 can be to provide thirty megawatts within thirty minutes for secondary reserve capacity.

The process 400 includes determining an operating load limit for the electric generator based on the first requirement and the second requirement (406). For example, the operating load limit for the electric generator 242 based on the first requirement and the second requirement may be twenty-five megawatts.

The process 400 includes operating the electric generator to power an electric load at or below the operating load limit (408). For example, the grid monitoring server 260 can operate the electric generator 242 to power an electric load at or below twenty-five megawatts. Other generators, e.g., including electric generator 244, can be operated to power electric load in excess of twenty-five megawatts.

The characteristics of the primary electrical distribution system can be used for various purposes. For example, the characteristics of the primary electrical distribution system can be used for live grid monitoring, for building a historical grid database, or for developing a model of the electrical grid. The primary electrical distribution characteristics can be used to evaluate when equipment is predicted to degrade or fail. The primary electrical distribution characteristics can also be used to identify anomalies and deficiencies in the electrical grid.

The described systems, methods, and techniques may be implemented in digital electronic circuitry, computer hardware, firmware, software, or in combinations of these elements. Apparatus implementing these techniques may include appropriate input and output devices, a computer processor, and a computer program product tangibly embodied in a machine-readable storage device for execution by a programmable processor. A process implementing these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially-designed ASICs (application-specific integrated circuits).

It will be understood that various modifications may be made. For example, other useful implementations could be achieved if steps of the disclosed techniques were performed in a different order and/or if components in the disclosed systems were combined in a different manner and/or replaced or supplemented by other components. Accordingly, other implementations are within the scope of the disclosure.

Functional operations described in this specification may be implemented in digital electronic circuitry, or in computer software, firmware, or hardware, including the structures disclosed in this specification and their structural equivalents, or in combinations of one or more of them. The techniques disclosed may be implemented as one or more computer program products, i.e., one or more modules of computer program instructions encoded on a computer-readable medium for execution by, or to control the operation of, data processing apparatus. The computer readable-medium may be a machine-readable storage device, a machine-readable storage substrate, a memory device, a composition of matter affecting a machine-readable propagated signal, or a combination of one or more of them. The computer-readable medium may be a non-transitory computer-readable medium. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD- ROM and DVD-ROM disks. The processor and the memory may be supplemented by, or incorporated in, special purpose logic circuitry.

To provide for interaction with a user, the techniques disclosed may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Implementations may include a computing system that includes a back end component, e.g., as a data server, or that includes a middleware component, e.g., an application server, or that includes a front end component, e.g., a client computer having a graphical user interface or a Web browser through which a user may interact with an implementation of the techniques disclosed, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

Thus, particular implementations have been described. Other implementations are within the scope of the following claims. For example, the actions recited in the claims may be performed in a different order and still achieve desirable results.

What is claimed is:

1. A system comprising:

an electrical transformer connected to a primary electrical distribution system and to a secondary electrical distribution system, a plurality of electric meters including multiple clusters of electric meters, wherein:

each electric meter is configured to generate electrical data based on measurements taken at a respective load of the secondary electrical distribution system, and each electric meter is assigned to one of the multiple clusters of electric meters; and a grid monitoring system comprising one or more computers and one or more storage devices on which are stored instructions that are operable, when executed by the one or more computers, to cause the one or more computers to perform operations comprising:

for a cluster of the multiple clusters of electric meters:

assigning, at a first time, a first electric meter in the cluster to aggregate electrical data from the electric meters in the cluster, the aggregation including summing measured values represented by the electrical data from the electric meters in the cluster;

receiving, from the first electric meter, the aggregated electrical data, wherein the aggregated electrical data indicates one or more characteristics of the secondary electrical distribution system connected to the electrical transformer;

assigning a second electric meter as a backup to the first electric meter;

receiving, from the second electric meter, second aggregated electrical data from the electric meters in the cluster;

determining a difference between the second aggregated electrical data received from the second electric meter and the aggregated electrical data received from the first electric meter; and responsive to determining that the difference is greater than a threshold difference, performing one or more actions, the one or more actions including one or more of:

generating an alert;

assigning a third electric meter to aggregate the electrical data from the electric meters in the cluster; or increasing frequency of collecting the aggregated electrical data; for an electric generator:

determining a first requirement for a first type of reserve capacity, the first requirement including a first amount of electrical power and a first time requirement for providing the first amount of electrical power;

determining a second requirement for a second type of reserve capacity, the second requirement including a second amount of electrical power and a second time requirement for providing the second amount of electrical power, the second time requirement being different from the first time requirement;

determining an operating load limit for the electric generator based on the first requirement and the second requirement, wherein the electric generator is electrically connected to and supplies power to an electric load, other than the primary electrical distribution system;

controlling operation of the electric generator to power the electric load, the electric load being at or below the operating load limit;

determining, based on the aggregated electrical data, a load demand of the primary electrical distribution system connected to the electrical transformer;

determining, based on the load demand, that the primary electrical distribution system requires the first type of reserve capacity or the second type of reserve capacity; and in response, electrically connecting the electric generator to the primary electrical distribution system to provide the first type of reserve capacity based on the first requirement or the second type of reserve capacity based on the second requirement.

2. The system of claim 1, wherein the one or more characteristics of the secondary electrical distribution system comprise at least one of a voltage, a current, or an electrical load.

3. The system of claim 1, the operations comprising:

determining, based on the aggregated electrical data, one or more characteristics of the primary electrical distribution system connected to the electrical transformer; and assigning the one or more characteristics of the primary electrical distribution system to a position of the primary electrical distribution system that corresponds to a location where the electrical transformer connects to the primary electrical distribution system.

4. The system of claim 1, the operations comprising receiving the aggregated electrical data at designated time intervals.

5. The system of claim 1, wherein the assigned electric meter is configured to aggregate the electrical data by polling each electric meter of the cluster.

6. The system of claim 1, wherein assigning the first electric meter to aggregate the electrical data from the electric meters in the cluster comprises randomly assigning the first electric meter out of the electric meters in the cluster.

7. The system of claim 1, wherein the aggregated electrical data comprises a geographic locator that is only specific to the cluster of electric meters.

8. The system of claim 1, the operations comprising repeatedly assigning, at random intervals, electric meters to aggregate the electrical data from the cluster.

9. A computer-implemented method comprising:

for a cluster of multiple clusters of electric meters:

assigning, at a first time, a first electric meter in the cluster to aggregate electrical data from the electric meters in the cluster, the aggregation including summing measured values represented by electrical data from the electric meters in the cluster, wherein each electric meter is configured to generate the electrical data based on measurements taken at a respective load of a secondary electrical distribution system;

receiving, from the first electric meter, the aggregated electrical data, wherein the aggregated electrical data indicates one or more characteristics of the secondary electrical distribution system, wherein an electrical transformer is connected to the secondary electrical distribution system and to a primary electrical distribution system;

assigning a second electric meter as a backup to the first electric meter;

receiving, from the second electric meter, second aggregated electrical data from the electric meters in the cluster;

determining a difference between the second aggregated electrical data received from the second electric meter and the aggregated electrical data received from the first electric meter; and responsive to determining that the difference is greater than a threshold difference, performing one or more actions, the one or more actions including one or more of:

generating an alert;

assigning a third electric meter to aggregate the electrical data from the electric meters in the cluster; or increasing frequency of collecting the aggregated electrical data; for an electric generator:

determining a first requirement for a first type of reserve capacity, the first requirement including a first amount of electrical power and a first time requirement for providing the first amount of electrical power;

determining a second requirement for a second type of reserve capacity, the second requirement including a second amount of electrical power and a second time requirement for providing the second amount of electrical power, the second time requirement being different from the first time requirement;

determining an operating load limit for the electric generator based on the first requirement and the second requirement, wherein the electric generator is electrically connected to and supplies power to an electric load, other than the primary electrical distribution system;

controlling operation of the electric generator to power the electric load, the electric load being at or below the operating load limit;

determining, based on the aggregated electrical data, a load demand of the primary electrical distribution system connected to the electrical transformer;

determining, based on the load demand, that the primary electrical distribution system requires the first type of reserve capacity or the second type of reserve capacity; and in response, electrically connecting the electric generator to the primary electrical distribution system to provide the first type of reserve capacity based on the first requirement or the second type of reserve capacity based on the second requirement.

10. The method of claim 9, wherein the one or more characteristics of the secondary electrical distribution system comprise at least one of a voltage, a current, or an electrical load.

11. The method of claim 9, comprising:

determining, based on the aggregated electrical data, one or more characteristics of the primary electrical distribution system connected to the electrical transformer; and assigning the one or more characteristics of the primary electrical distribution system to a position of the primary electrical distribution system that corresponds to a location where the electrical transformer connects to the primary electrical distribution system.

12. The method of claim 9, comprising receiving the aggregated electrical data at designated time intervals.

13. The method of claim 9, wherein the assigned electric meter is configured to aggregate the electrical data by polling each electric meter of the cluster.

14. The method of claim 9, wherein assigning the first electric meter to aggregate the electrical data from the electric meters in the cluster comprises randomly assigning the first electric meter out of the electric meters in the cluster.

15. The method of claim 9, wherein the aggregated electrical data comprises a geographic locator that is only specific to the cluster of electric meters.

16. The method of claim 9, comprising repeatedly assigning, at random intervals, electric meters to aggregate the electrical data from the cluster.

17. A non-transitory computer storage medium encoded with instructions that, when executed by one or more computers, cause the one or more computers to perform operations comprising:

for a cluster of multiple clusters of electric meters:

assigning, at a first time, a first electric meter in the cluster to aggregate electrical data from the electric meters in the cluster, the aggregation including summing measured values represented by electrical data from the electric meters in the cluster, wherein each electric meter is configured to generate the electrical data based on measurements taken at a respective load of a secondary electrical distribution system;

receiving, from the first electric meter, the aggregated electrical data, wherein the aggregated electrical data indicates one or more characteristics of the secondary electrical distribution system, wherein an electrical transformer is connected to the secondary electrical distribution system and to a primary electrical distribution system;

assigning a second electric meter as a backup to the first electric meter;

receiving, from the second electric meter, second aggregated electrical data from the electric meters in the cluster;

determining a difference between the second aggregated electrical data received from the second electric meter and the aggregated electrical data received from the first electric meter; and responsive to determining that the difference is greater than a threshold difference, performing one or more actions, the one or more actions including one or more of:

generating an alert;

assigning a third electric meter to aggregate the electrical data from the electric meters in the cluster; or increasing frequency of collecting the aggregated electrical data;

for an electric generator:

determining a first requirement for a first type of reserve capacity, the first requirement including a first amount of electrical power and a first time requirement for providing the first amount of electrical power;

determining a second requirement for a second type of reserve capacity, the second requirement including a second amount of electrical power and a second time requirement for providing the second amount of electrical power, the second time requirement being different from the first time requirement;

determining an operating load limit for the electric generator based on the first requirement and the second requirement, wherein the electric generator is electrically connected to and supplies power to an electric load, other than the primary electrical distribution system;

controlling operation of the electric generator to power the electric load, the electric load being at or below the operating load limit;

determining, based on the aggregated electrical data, a load demand of the primary electrical distribution system connected to the electrical transformer;

determining, based on the load demand, that the primary electrical distribution system requires the first type of reserve capacity or the second type of reserve capacity; and in response, electrically connecting the electric generator to the primary electrical distribution system to provide the first type of reserve capacity based on the first requirement or the second type of reserve capacity based on the second requirement.

18. The non-transitory computer storage medium of claim 17, the operations comprising:

determining, based on the aggregated electrical data, one or more characteristics of the primary electrical distribution system connected to the electrical transformer; and assigning the one or more characteristics of the primary electrical distribution system to a position of the primary electrical distribution system that corresponds to a location where the electrical transformer connects to the primary electrical distribution system.

19. The non-transitory computer storage medium of claim 17, wherein the assigned electric meter is configured to aggregate the electrical data by polling each electric meter of the cluster.

20. The non-transitory computer storage medium of claim 17, wherein assigning the first electric meter to aggregate the electrical data from the electric meters in the cluster comprises randomly assigning the first electric meter out of the electric meters in the cluster, the operations comprising repeatedly assigning, at random intervals, electric meters to aggregate the electrical data from the cluster.

\* \* \* \* \*